United States Patent [19]

Banks et al.

[11] Patent Number: 4,857,437

[45] Date of Patent: Aug. 15, 1989

[54] PROCESS FOR THE FORMATION OF AN IMAGE

[75] Inventors: Christopher P. Banks; Christopher G. Demmer, both of Saffron Walden; Edward Irving, Burwell, all of England

[73] Assignee: Ciba-Geigy Corporation, Ardsley, N.Y.

[21] Appl. No.: 129,579

[22] Filed: Dec. 7, 1987

[30] Foreign Application Priority Data

Dec. 17, 1986 [GB] United Kingdom ............... 8630129
Apr. 22, 1987 [GB] United Kingdom ............... 8709520

[51] Int. Cl.$^4$ .............. G03C 5/00; G03C 1/727; G03C 1/495; G03C 1/68
[52] U.S. Cl. .................................. 430/327; 430/270; 430/281; 430/326; 430/325; 430/190; 430/394; 430/494; 430/18
[58] Field of Search ............... 430/18, 327, 394, 494, 430/190, 325, 326, 281

[56] References Cited

U.S. PATENT DOCUMENTS

| | | |
|---|---|---|
| 3,849,137 | 11/1974 | Barzynski et al. |
| 3,991,033 | 11/1976 | Sam |
| 4,058,400 | 11/1977 | Crivello |
| 4,058,401 | 11/1977 | Crivello |
| 4,086,210 | 4/1978 | Petropoulos |
| 4,299,938 | 11/1981 | Green et al. |
| 4,339,567 | 7/1982 | Green et al. |
| 4,368,253 | 1/1983 | Green et al. |
| 4,383,025 | 5/1983 | Green et al. |
| 4,398,014 | 8/1983 | Green et al. |
| 4,518,676 | 5/1985 | Irving |
| 4,590,287 | 5/1986 | Riediker et al. |
| 4,618,564 | 10/1986 | Demmer et al. |
| 4,632,891 | 12/1986 | Banks et al. |
| 4,632,900 | 12/1986 | Demmer et al. |

FOREIGN PATENT DOCUMENTS

1516351 7/1978 United Kingdom.
1539192 1/1979 United Kingdom.

OTHER PUBLICATIONS

Derwent Abst. 83-828644.
Derwent Abst. 83-828645.
Derwent Abst. 85-312194.
Derwent Abst. 86-286380.

*Primary Examiner*—Paul R. Michl
*Assistant Examiner*—Christopher RoDee
*Attorney, Agent, or Firm*—JoAnn Villamizar; Edward McC. Roberts

[57] ABSTRACT

A process for the formation of an image comprises
(i) applying to a substrate a layer of a liquid composition comprising
 (A) a residue which is cationically polymerisable or polymerizable by means of free radicals,
 (B) a radiation-activated polymerisation initiator for (A) and
 (C) a radiation-solubilizable residue,
(ii) subjecting the composition to radiation having a wavelength at which (B) is activated but at which (C) is not substantially activated, optionally followed by heating, thereby polymerising (A) such that the layer of liquid composition is solidified,
(iii) subjecting the solidified layer in a predetermined pattern to radiation having a wavelength which is different from that of the radiation used in stage (ii) and at which the residue (C) is activated, such that the solidified layer is rendered more soluble in a developer in exposed areas than in unexposed areas, and
(iv) removing the exposed areas by treatment with a developer.

The process is useful in the production of printing plates and printed circuits.

19 Claims, No Drawings

PROCESS FOR THE FORMATION OF AN IMAGE

This invention relates to a process for the formation of an image which is useful in the production of printing plates and printed circuits.

In conventional processes for the formation of positive images, a solid layer of a positive photoresist is formed on a substrate by coating the substrate with a solution of the photoresist in a volatile organic solvent, followed by evaporation of the solvent. The solid photoresist, such as a phenolic novolak resin containing a quinone diazide residue or a mixture of a film-forming resin and a quinone diazide compound, is then exposed to actinic radiation in a predetermined pattern, usually through an image-bearing transparency, so that parts of the solid photoresist layer struck by the radiation become more soluble in a developing solvent, while those parts shielded from the radiation remain substantially unaffected. The exposed parts are removed by treatment with a solvent developer, usually an aqueous alkali solution, which dissolves the exposed parts but does not dissolve the unexposed parts during the period for which the treatment is carried out, to leave a positive image.

There is a need for a process in which a solid, substantially non-tacky layer of a positive photoresist, ready for imagewise irradiation can be formed without the need to evaporate organic solvents. Such a process would avoid the use of solvents which might present problems of toxicity and flammability and also cause expense in their recovery. It would also facilitate the production on a continuous basis of photoresist-coated supports, such as coated copper-clad laminates, ready for imagewise irradiation.

It has been proposed, in European Patent Publication No. 0 155 231, to form positive images by imagewise irradiation of solid positive photoresist layers formed by electrodeposition. Whilst such a process need involve the use of only small amounts of organic solvent, it requires the use of materials having salt-forming groups and is therefore of limited applicability. There is a need for a process of wider applicability which avoids the need to evaporate organic solvents.

Accordingly, the present invention provides a process for the formation of an image which comprises
(i) applying to a substrate a layer of a liquid composition comprising
   (A) a residue which is cationically polymerisable or polymerisable by means of free radicals,
   (B) a radiation-activated polymerisation initiator for (A), and
   (C) a radiation-solubilisable residue,
(ii) subjecting the composition to radiation having a wavelength at which (B) is activated but at which (C) is not substantially activated, optionally followed by heating, thereby polymerising (A) such that the layer of liquid composition is solidified,
(iii) subjecting the solidified layer in a predetermined pattern to radiation having a wavelength which is different from that of the radiation used in stage (ii) and at which the residue (C) is activated, such that the solidified layer is rendered more soluble in a developer in exposed areas than in unexposed areas, and
(iv) removing the exposed areas by treatment with a developer.

The expression "subjecting . . . in a predetermined pattern to radiation" includes both exposure through an image-bearing transparency consisting of opaque and transparent parts, and also subjection to a beam of radiation moved in a predetermined pattern, for example as directed by a computer, so as to form an image. The liquid composition used in the process of the invention may comprise (B) a radiation-activated initiator and (1) a mixture of at least one substance having a polymerisable residue (A) and at least one substance having a radiation solubilisable residue (C) which is activated by radiation at a wavelength which is different from that at which (B) is activated, or
(2) at least one dual-functional substance having in the same molecule a polymerisable residue (A) and a radiation-solubilisable residue (C) which is activated by radiation at a wavelength which is different from that at which (B) is activated, or
(3) at least one said dual-functional substance together with at least one substance having a polymerisable residue (A) and/or at least one substance having a radiation-solubilisable residue (C).

The residue (C) may be activated by radiation at a shorter wavelength than that at which (B) is activated. In this embodiment the irradiation in stage (ii) and the irradiation in stage (iii) may both be carried out using ultraviolet radiation, that used in stage (iii) having a shorter wavelength, or preferably, the first irradiation is effected using radiation in the visible spectrum and the second irradiation is effected using ultraviolet radiation. Alternatively, (C) may be activated by radiation at a longer wavelength than that at which (B) is activated. Thus stage (iii) can be effected using radiation having a shorter or longer wavelength than the radiation used in stage (ii).

The polymerisation initiator (B) must absorb radiation at a longer or shorter wavelength than the photosolubilisable residue (C). When (B) absorbs at a longer wavelength, preferably residue (C) does not absorb radiation at a wavelength above 500 nm.

Residues, i.e. groups or combinations of groups, which are polymerisable by means of free radicals suitable for use as residue (A) are well known and may be an ethylenically unsaturated group or a mixture of an ethylenically unsaturated group and a thiol group.

Suitable substances having an ethylenically unsaturated residue include vinyl-substituted aromatic compounds such as styrene, substituted styrenes, for example, alpha-methylstyrene, 4-methylstyrene and 4-bromostyrene, vinyl esters such as vinyl acetate, allyl compounds such as diallyl maleate and dimethallyl fumarate and vinyl heterocyclics such as 2-, 3-, or 4-vinylpyridine and 2- or 3-vinylpyrrolidine.

Preferred ethylenically unsaturated substances are esters of ethylenically unsaturated monocarboxylic acids, preferably those having a group formula

$$CH_2=C(R^1)COO- \qquad \qquad I$$

where $R^1$ is a hydrogen, chlorine, or bromine atom or an alkyl group of 1 to 4 carbon atoms, especially a hydrogen atom or a methyl group.

Suitable such esters are acrylates and 2-substituted acrylates of monohydric alcohols such as 2-methoxyethanol, 2-cyanoethanol, furfuryl alcohol, glycidol, and cyclohexanol, and full or partial esters of polyhydric alcohols such as butane diol, pentaerythritol, dipentaerythritol, tri- and tetraethylene glycol, trimethylolpropane and glycerol. Also suitable are esters formed by reaction of an alkylene oxide, particularly ethylene oxide or propylene oxide, with an acrylic acid, typically 2-hydroxyethyl and 2-hydroxypropyl acrylates and methacrylates. There may also be used esters formed by reaction of a compound containing one or more glycidyl groups, especially a mono- or polyglycidyl ether of a mono- or polyhydric alcohol or phenol or a N-glycidylhydantoin, with acrylic or methacrylic acid. Other suitable compounds are esters formed by reaction of a diepoxide with an adduct of a hydroxyalkyl acrylate or methacrylate with a saturated or unsaturated dicarboxylic acid anhydride such as succinic, maleic, or phthalic anhydride.

Typical such compounds include 1,4-bis(2-hydroxy-3-acryloyloxypropoxy)butane, a poly(2-hydroxy-3-acryloyloxypropyl) ether of a bisphenol or a phenol-formaldehyde novolak, 2,2-bis(4-(2-hydroxy-3-(2-acryloyloxyethoxy)succinyloxypropoxy)phenyl)propane, neopentyl diacrylate, trimethylolpropane trisacrylate, pentaerythritol tetraacrylate, bis(2-hydroxy-3-acryloyloxypropyl)adipate, and the corresponding methacrylates.

Particularly preferred ethylenically unsaturated substances are those having one ethylenically unsaturated group, especially monoacrylates and monomethacrylates such as acrylic acid, 1-(2-hydroxy-3-acryloyloxy-propoxy)-butane, -octane and -decane, 2-hydroxy-3-acryloyloxypropyl propionate, 3-phenoxy-2-hydroxypropyl acrylate, 2-hydroxyethyl acrylate, 2-hydroxypropyl acrylate, and the corresponding methacrylates.

The polyfunctional acrylates and methacrylates are generally used together with monofunctional acrylates and methacrylates.

Polyenes that, mixed with polythiols, may be used to provide residue (A), include those having at least two groups of the formula $$-[C(R^2)_r]C(R^2)=C(R^2)-R^2 \qquad \text{II}$$

or $$-X-C(R^2)=C(R^2)-R^2 \qquad \text{III}$$

where
the groups $R^2$, which may be the same or different, are selected from hydrogen, fluorine and chlorine atoms and furyl, thienyl, pyridyl, phenyl, substituted phenyl, benzyl and substituted benzyl, alkyl, substituted alkyl, alkoxy and substituted alkoxy of from 1 to 9 carbon atoms and cycloalkyl and substituted cycloalkyl groups of from 3 to 8 carbon atoms, the substituents being selected from chlorine and fluorine atoms and acetoxy, nitro, acetamido, phenyl, benzyl, alkyl, alkoxy and cycloalkyl groups,
r is an integer of from 1 to 9, and
X represents a group $-NR^2-$, $-O-$, or $-S-$.

The polyenes usually have a molecular weight of 50 to 5000 and contain two or more ethylenic bonds capable of participating in a free-radical polymerisation reaction. Preferred polyenes include the reaction product of 1 mole of tolylene diisocyanate with 2 moles of dialkenyl ether of trimethylol propane, the reaction product of 1 mole of a polymeric diisocyanate with 2 moles of allyl alcohol, the reaction product of 1 mole of polyethylene glycol with 2 moles of tolylene-2,4-diisocyanate and 2 moles of allyl alcohol, polyisoprene, polybutadiene and other unsaturated polymers in which the unsaturation occurs primarily within the main chain of the molecule, compounds having reactive unsaturated carbon to carbon bonds conjugated with adjacent unsaturated groupings, such as polyethylene ether glycol diacrylate, having a molecular weight of about 750, polytetramethylene ether glycol dimethacrylate having a molecular weight of about 1175, and the triacrylate of the reaction product of trimethylolpropane with 20 moles of ethylene oxide, and reaction products of polyepoxides with amines, alcohols, thioalcohols, or acids having aliphatic unsaturation, such as the reaction product of bisphenol A diglycidyl ether with allylamine or diallylamine. Especially preferred polyenes are phenols, particularly bisphenols, substituted by 2 or more allyl or methallyl groups.

Polythiols that, mixed with these polyenes, may also be used as part (A) have the general formula $$R^3(SH)_t \qquad \text{IV}$$

where $R^3$ is a polyvalent organic group free from reactive carbon-to-carbon unsaturation and t is at least 2.

Preferably the organic group $R^3$ is an aliphatic chain of 2 to 10 carbon atoms, an arylene group of 6 to 10 carbon atoms, an alkarylene group of 7 to 16 carbon atoms, a cycloalkylene group of 5 to 10 carbon atoms, or a cycloalkyl alkylene group of 6 to 16 carbon atoms, any of which may be substituted and may contain oxygen atoms or ester groups in the alkylene chains. Specific examples of preferred polythiols include ethylene glycol bis(thioglycollate), ethylene glycol bis(beta-mercaptopropionate), trimethylol propane tris(thioglycollate), trimethylolpropane tris(beta mercaptopropionate), pentaerythritol tetrakis (thioglycolate), pentaerythritol tetrakis(beta-mercaptopropionate), and thioglycolates, beta-mercaptopropionates and 3-mercapto-2-hydroxypropyl ethers of polyoxyalkylene glycols and triols such as polypropylene ether glycol bis(beta-mercaptopropionate) and a 3-mercapto-2-hydroxypropyl ether of a polyoxypropylene triol drived from glycerol.

The molar ratio of ene:thiol groups must be selected so as to give a solid product on exposure to radiation, ratios within the range 1:0.5-2 being preferred.

Suitable polymerisation initiators (B) for use where (A) is a residue polymerisable by means of free radicals may be sensitive to visible light or ultraviolet radiation.

Such initiators are known and include benzoin ethers, acyloin ethers, halogenated alkyl or aryl derivatives, aromatic carbonyl derivatives, metallocenes, mixtures of Group IVA organometallic compounds with photoreducible dyes, quinones optionally mixed with aliphatic amines having hydrogen attached to an aliphatic alpha carbon atom, aliphatic dicarbonyl compounds, optionally mixed with an amine, 3-ketocoumarins, acyl phosphine oxides, metal carbonyls, and mixtures of photoreducible dyes with reducing agents. Preferred polymerisation initiators (B) are camphorquinone with a teritary amine having a hydrogen atom attached to an aliphatic alpha carbon atom, such as bis(4-dimethylamino)benzophenone and triethanolamine, biacetyl, dimanganese decacarbonyl, benzil dimethyl ketal, isobutyl benzoin ether, 2,2,2-trichloro-4'-tert-.butylacetophenone, diethoxyacetophenone, coumarins having a carbocyclic or heterocyclic aromatic ketone group in the 3-position, such as 3-benzoyl-7-methoxy coumarin or 3-(4-cyanobenzoyl)-5,7-dipropoxy coumarin, mixtures of photoreducible dyes, typically methylene blue or rose bengal, with a stannane such as trimethyl benzyl stannane, tributyl benzyl stannane, tributyl 4-methylbenzyl stannane or dibutyl dibenzyl stannane, mixtures of photoreducible dyes with an electron donor such as sodium benzenesulphinate or benzenesulphinic acid, and a titanium metallocene such as bis(pimethylcyclopentadienyl)bis(sigma pentafluorophenyl)titanium (IV) or bis(pi-methylcyclopentadienyl)bis(sigma hexyloxytetrafluorophenyl) titanium (IV).

Compositions as described in which the initiator (B) is a metallocene or a mixture of a Group IVA organometallic compound with a photoreducible dye are themselves new. This invention therefore provides new compositions, suitable for use in the process described comprising (A) a residue that is polymerisable by means of free radicals, (B) a radiation-activated polymerisation initiator for (A) that is a metallocene or a mixture of a Group IVA organometallic compound with a photoreducible dye, and (C) a radiation-solubilisable residue, the residue (C) being activatable by radiation at a wavelength which is different from that at which the initiator (B) is activatable.

Preferred metallocenes that are used in the new compositions are the titanocenes of formula

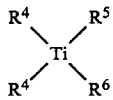

V where
each group $R^4$ is independently selected from an optionally substituted cyclopentadienyl or indenyl group or together they form an alkylidene group of 2 to 12 carbon atoms, a cycloalkylidene group having from 5 to 7 carbon atoms in the ring, a group $Si(R^7)_2$ or $Sn(R^7)_2$, or an optionally substituted group of formula

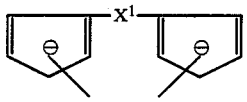

$X^1$ denotes a methylene, ethylene, or 1,3-propylene group, $R^5$ denotes a 6-membered carbocyclic or 5- or 6-membered heterocyclic aromatic ring, substituted by a fluorine atom in at least one of the two positions ortho to the metal-carbon bond, the ring optionally being further substituted, or $R^5$ with $R^6$ denotes a group —Q—Y—Q—, Q denotes a 5- or 6-membered carbocyclic or heterocyclic aromatic ring, in which each of the two bonds is ortho to the Q—Y bond, and each position meta to the Q—Y bond is substituted by fluorine, the groups Q optionally being further substituted, Y denotes a methylene group, an alkylidene group having from 2 to 12 carbon atoms, a cycloalkylidene group having from 5 to 7 carbon atoms in the ring, a direct bond, a group $NR^7$, an oxygen or sulphur atom, or a group —SO—, —CO—, —$Si(R^7)_2$— or —$Sn(R^7)_2$—, $R^6$ denotes an alkynyl or phenylalkynyl group that may be substituted, an azido or cyano group, or a group of formula $Si(R^7)_2$ or $Sn(R^7)_2$, or it has the same meaning as the group $R^5$, and $R^7$ denotes an alkyl group of from 1 to 12 carbon atoms, a cycloalkyl group of from 5 to 12 carbon atoms, an aryl group of from 6 to 16 carbon atoms, or an aralkyl group of from 7 to 16 carbon atoms.

The $R^4$ groups are preferably identical. Suitable substituents for $R^4$ are: linear or branched alkyl, alkoxy and alkenyl of preferably up to 18, especially up to 12 and most preferably up to 6, carbon atoms, e.g. methyl, ethyl, propyl, isopropyl, n-butyl, tert-butyl, pentyl, hexyl, octyl, decyl, dodecyl, tetradecyl, hexadecyl, octadecyl and corresponding alkenyl and alkoxy groups; cycloalkyl and cycloalkenyl containing preferably 5 to 8 ring carbon atoms, e.g. cyclopentyl, cyclohexyl, cycloheptyl, methylcyclopentyl and methylcyclohexyl; aryl of preferably 6 to 16 carbon atoms and aralkyl of preferably 7 to 16 carbon atoms, e.g. phenyl, naphthyl, biphenyl, benzyl and phenylethyl; nitrilo, halogen, preferably F, Cl and Br, and also amino, preferably tertiary amino which may contain linear or branched alkyl groups of 1 to 12, preferably 1 to 6, carbon atoms, in particular methyl or ethyl, or phenyl and benzyl, which amino groups can also be quaternised, in particular with linear or branched alkyl halides containing preferably 1 to 12 carbon atoms, preferably methyl or ethyl halides; linear or branched aminoalkyl, preferably tertiary aminoalkyl which may also be quaternised, in particular with alkyl halides, and the alkylene group in the aminoalkyl can be linear or branched and contains preferably 1 and 12, most preferably 1 to 6, carbon atoms, and is most preferably α-branched $C_1$-$C_{12}$ alkyl.

The radicals $R^4$ may contain 1 to 3 substituents, but preferably contain one substituent. It is preferred that both substituents $R^4$ are cyclopentadienyl$^\ominus$ or methylcyclopentadienyl$^\ominus$.

Alkylidene groups $X^1$ and Y preferably contain 2 to 6 carbon atoms. Exemplary of alkylidene groups and cycloalkylidene groups $X^1$ and Y are ethylidene, 2,2-propylidene, butylidene, hexylidene, phenylmethylene, diphenyl-methylene, cyclopentylidene and cyclohexylidene. $X^1$ is most preferably methylene. $R^7$ as alkyl preferably contains 1 to 6 carbon atoms and is e.g. methyl, ethyl, propyl, butyl or hexyl; $R^7$ as cycloalkyl is preferably cyclopentyl or cyclohexyl; and as aryl is preferably phenyl; and as aralkyl is preferably benzyl.

$R^5$ preferably substituted in both ortho-positions by fluorine.

$R^5$ as carbocyclic aromatic and fluorine-substituted ring may be indene, indane, fluorene, naphthalene and preferably phenyl. Examples are: 4,6-difluoroinden-5-yl, 5,7-difluoroinden-6-yl, 2,4-difluorofluoren-3-yl, 1,3-difluoronaphth-2-yl and, preferably, 2,6-difluorophen-1-yl.

$R^5$ as heterocylic aromatic 5-membered ring preferably contains one hetero-atom and, as 6-membered ring, contains preferably 1 or 2 hetero-atoms. Examples of such rings substituted by two fluorine atoms are: 2,4-difluoropyrrol-3-yl, 2,4-difluorofur-3-yl, 2,4-difluorothiophen-3-yl, 2,4-difluoropyrid-3-yl, 3,5-difluoropyrid-4-yl and 4,6-difluoropyrimid-5-yl.

$R^5$ and $R^6$ together as a group of formula —Q—Y—Q— may be e.g.:

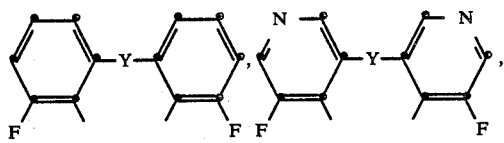

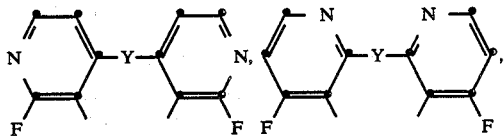

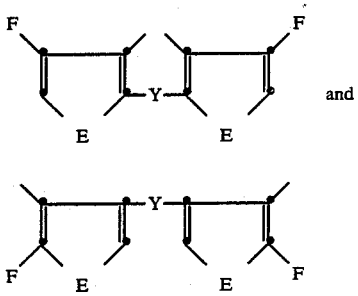

and

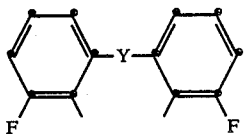

wherein Y has the above meaning and is in particular a direct bond, —CH₂— or —O—.

A preferred group of metallocenes of the formula V comprises those compounds wherein each $R^4$ is π-cyclopentadienyl or π-cyclopentadienyl which is substituted by $C_1$-$C_4$ alkyl, preferably methyl, and each of $R^5$ and $R^6$ is a radical of the formula

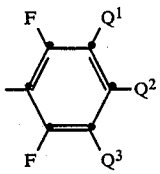

Va wherein each of $Q^1$, $Q^2$ and $Q^3$ independently is a hydrogen atom, F, Cl, Br, a tertiary amino group, preferably morpholino group, or an alkoxy group, preferably a methoxy or hexyloxy group. The amino or alkoxy group is preferably attached in the para-position to the free bond. A preferred subgroup comprises those metallocenes of the formula V, wherein each $R^4$ is π-methyl-cyclpentadienyl or π-cyclopentadienyl, and each of $R^5$ and $R^6$ is a radical of the formula Va, wherein $Q^1$ and $Q^3$ are H, F, Cl or Br and $Q^2$ is H, F or alkoxy. Preferably, each of $Q^1$ and $Q^3$ independently is a hydrogen or fluorine atom, and $Q^2$ is fluorine, or hexyloxy.

wherein E is O, S or NH. Y is preferably methylene, ethylidene, 2,2-propylidene, a direct bond, or O.

The radicals $R^5$ and the groups Q in groups —Q—Y—Q— can be partly or completely substituted by further groups. Suitable groups are: linear or branched alkyl or alkoxy, each preferably of 1 to 18, most preferably 1 to 6, carbon atoms, e.g. methyl, ethyl, propyl, butyl, pentyl, hexyl, and the corresponding alkoxy groups, with methyl, methoxy and hexyloxy being preferred; cycloalkyl containing preferably 5 or 6 ring carbon atoms, aryl of preferably 6 to 16 carbon atoms and aralkyl of preferably 7 to 16 carbon atoms, e.g. cyclopentyl, cyclohexyl, phenyl or benzyl; hydroxyl, carboxyl, CN, halogen such as F, Cl or Br, and amino, preferably tertiary amino which may be quaternised with an alkyl halide such as methyl chloride, methyl bromide or methyl iodide, examples of amino groups being methylamino, ethylamino, dimethylamino, diethylamino, pyrrolidyl, piperidyl, piperazyl, morpholyl, N-methylpiperazyl; alkoxycarbonyl containing preferably 1 to 18, most preferably 1 to 6, carbon atoms in the alkoxy moiety, aminocarbonyl containing one or two $C_1$-$C_{12}$ alkyl groups in the amino group, or aminocarbonyl containing heterocyclic amines such as pyrrolidine, piperidine, piperazine, N-methylpiperazine, and morpholine; aminoalkyl, especially tertiary aminoalkyl which preferably contains $C_1$-$C_6$ alkyl groups and which may be quaternised with an alkyl halide, most preferably tertiary aminoalkyl which may be substituted by $C_1$-$C_6$ alkyl, e.g. dimethylaminomethyl and trimethylammoniummethyl iodide.

$R^6$ as alkynyl is e.g. 2-butynyl and, preferably, propargyl.

Examples of substituents for $R^6$ as phenylalkynyl are halogen such as F, Cl, Br, $C_1$-$C_6$ alkyl and $C_1$-$C_6$ alkoxy, carboxyl, OH and CN. $R^6$ preferably has the meaning of $R^5$.

In a preferred embodiment of the invention, $R^5$ and $R^6$ in formula V are unsubstituted or substituted 2,6-difluorophen-1-yl or $R^5$ and $R^6$ together form a radical of the formula Compounds of formula V, and their preparation, are described in U.S. Pat. No. 4,590,287.

Preferred Group IVA organometallic compounds used in the new compositions are organostannanes of formula VI

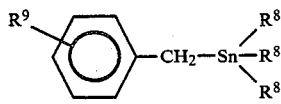

VI where $R^8$ denotes an alkyl group of from 1 to 4 carbon atoms, or an alkenyl or alkynyl group of from 2 to 4 carbon atoms, and $R^9$ denotes a hydrogen or halogen atom or an alkyl or alkoxy group of from 1 to 4 carbon atoms.

Preferred compounds of formula VI are those where $R^8$ denotes an alkyl group of 1 to 4 carbon atoms and $R^9$ denotes a hydrogen atom or an alkyl group of 1 to 4 carbon atoms.

These organostannanes are prepared by Grignard coupling of a benzyl magnesium halide with a trialkyltin halide in an inert solvent, followed by filtration, aqueous washing and distillation of the product.

Preferred photoreducible dyes that are used with these organostannanes are methylene blue and rose bengal.

Substances having cationically polymerisable residues suitable for use as residue (A) of the liquid composition are well known and may be, for example, a cationically polymerisable heterocyclic compound such as a cyclic ether, e.g. an oxetane or a tetrahydrofuran or a cyclic ester, e.g. a lactone or an episulphide, e.g. ethylene sulphide. Preferably (A) is a 1,2-epoxide, a vinyl ether or a mixture thereof. Suitable 1,2-epoxides include ethylene oxide, propylene oxide and epichlorohydrin. Preferred 1,2-epoxides are glycidyl ethers of monohydric alcohols or phenols, particularly monohydric alcohols or phenols, e.g. n-butyl glycidyl ether, iso-octyl glycidyl ether, phenyl glycidyl ether and cresyl glycidyl ether, cyclo-aliphatic epoxides, including monoepoxides such as alpha-pinene oxide and epoxide resins such as 3,4-epoxycyclohexylmethyl-3',4'-epoxycyclohexane carboxylate and its 6,6'-dimethyl derivative, and glycidyl esters, particularly of monocarboxylic acids such as propionic, cyclohexane carboxylic and benzoic acids. Suitable vinyl ethers include cyclic vinyl ethers containing a dihydroyran residue and, preferably, vinyloxyalkyl ethers of alcohols and phenols.

A wide range of cationic initiators for (A) may be used. For instance, the initiator (B) for cationically polymerisable residue (A) may be at least one compound of the formula

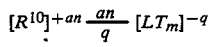  VII where
L is a divalent to heptavalent metal or non-metal, T is a halogen atom or one of the groups T may be hydroxyl, q is an integer from 1 to 3, m is an integer corresponding to the valency of L+q,
a is 1 or 2, n is an integer of 1 to 3 and $R^{10}$ is an ion selected from:
(i) aromatic iodonium ions, generally of formula Ar—I$^+$—Ar' wherein Ar and Ar' are substituted or unsubstituted aromatic radicals;
(ii) [G—Z—(CO)$_x$]$^+$
wherein G represents an arene or dienylium group; Z represents an atom of a d-block transition element chosen from titanium, vanadium, chromium, manganese, iron, cobalt, nickel, copper, niobium, molybdenum, ruthenium, rhodium, palladium, silver, tantalum, tungsten, rhenium, osmium, iridium, platinum and gold; and x is a positive integer such that the atom z has a closed shell electron configuration;
(iii) aromatic diazonium ions;
(iv) $[R^{11})(R^{12}M)_a]^{+an}$
wherein a is 1 or 2; n is an integer of 1 to 3, M is the cation of a monovalent to trivalent metal from groups IVb to VIIb, VIII or Ib of the Periodic Table; $R^{11}$ is a $\pi$arene and $R^{12}$ is a $\pi$arene or the anion of a $\pi$arene;
(v) sulphonium ions;
(vi) sulphoxonium ions; and
(vii) iodosyl ions.
When $R^{10}$ is an iodonium ion, the initiator may have the formula

[Ar$_h$—I—Ar'$_i$]$^{+j}$[LT$_m$]$^{-(k-1)}$   VIII wherein Ar is a monovalent aromatic radical; Ar' is a divalent aromatic radical; h is 0 or 2; i is 0 or 1; the sum of h+i is 2 or the valence of I; $j=k-1$; 1 is the valence of L; and k is greater than 1 and is an integer having a value up to 8; and L, and m are as defined above.

Radicals included by Ar can be the same or different aryl or aromatic heterocyclic radical having from 5 to 20 carbon atoms, which can be substituted with from 1 to 4 monovalent radicals, preferably $C_{(1-8)}$alkoxy, $C_{(1-8)}$alkyl, nitro or chloro. Ar is more particularly, phenyl, chlorophenyl, nitrophenyl, methoxyphenyl or pyridyl. Radicals included by Ar' are arylene radicals, preferably $C_{12}$–$C_{20}$ dinuclear radicals such as

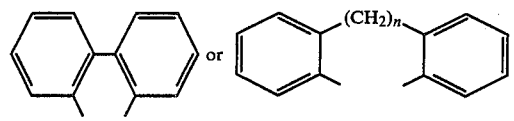

where n is 1 to 3, preferably 1 to 2.

The iodonium salts are used in combination with a dye sensitiser, when (B) is to be activated by radiation in the visible spectrum.

Dyes which can be used in combination with the above identified aryliodonium salts in the practice of the invention are cationic dyes, such as shown in Vol. 20, p. 194–7 of the Kirk-Othmer Encyclopedia, 2nd Edition, John Wiley and Sons, New York. Some of the cationic dyes which can be used are, for example,
Acridine orange; C.I. 46005
Acridine yellow; C.I. 46035
Phosphine R; C.I. 46045
Benzoflavin; C.I. 46065
Setoflavin T; C.I. 49005
In addition to the above, basic dyes can also be used. Some of these basic dyes are shown in Vol. 7, p. 532–4 or Kirk-Othmer Encyclopedia, as cited above and include
Hematoporphyrin
4,4'-bisdimethylaminobenzophenone
4,4'-bisdiethylaminobenzophenone
When $R^{10}$ is a cation (ii), the initiator may have the formula

[G—Z—(CO)$_x$]$^+$[LT$_m$]$^-$   IX wherein G, Z, x, L, T and m are as defined above.

When G denotes an arene group i.e., is itself a 6-electron ligand, this may be a mononuclear or polynuclear group, including a condensed ring group. Preferably it is a hydrocarbon group, optionally substituted by one or more alkoxy groups, and preferably it contains from 6 to 18 carbon atoms, such as benzene, toluene, mesitylene, naphthalene, biphenyl, phenanthrene, fluorene, and anthracene.

When G denotes a dienylium group it is preferably a cyclic group of one of the following formulae

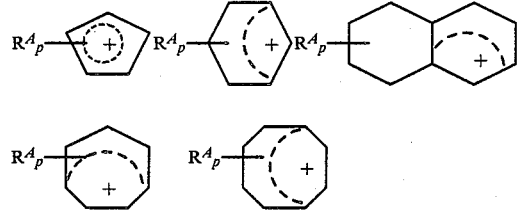

where
$R^A$ denotes an alkyl group of 1 to 4 carbon atoms, an alkoxy group of 1 to 4 carbon atoms, or an alkyl group interrupted by one or more oxycarbonyl groups and containing up to 12 carbon atoms, and p is zero, 1, 2 or 3.

z preferably represents chromium, cobalt, nickel, and particularly iron or manganese.

Individual salts of formula IX, where G denotes an arene group, which are particularly preferred include the hexafluorophosphates of π-toluenetricarbonylmanganese, π-benzenetricarbonylmanganese, π-mesitylenetricarbonylmanganese, π-1-methyl-5,6,7,8-tetrahydronaphthalenetricarbonylmanganese, π-hexylbenzenetricarbonylmanganese, π-methoxybenzene tricarbonylmanganese, and π-hexyloxybenzenetricarbonylmanganese.

These salts satisfy the requirement that the central atom (manganese) has a closed electron shell configuration, i.e. 18 electrons in its valency shell, univalent manganese in the unipositive cation contributing 6 electrons, the arene group contributing 6 electrons, and the three carbonyl groups contributing 2 electrons each.

Salts of formula IX where G denotes an arene or dienylium group are in general known and can be prepared as described in EP-A-O 094 914.

Individual salts of formula IX, where G denotes a cyclic dienylium group, which are particularly preferred included tricarbonyl(cyclohexa-1,3-dienylium)iron tetrafluoroborate, tricarbonyl(1-methylcyclohexa-2,4-dienylium)iron hexafluorophosphate, tricarbonyl(1-methyl-4-methoxycylohexa-2,4-dienylium) iron hexafluorophosphate, tricarbonyl(2-methoxybicyclo[4.4.0-]deca-2,4-dienylium)iron hexafluorophosphate, tricarbonyl(1-(acetoxy-methyl)-2-(methoxycarbonylacetoxy)ethylcyclohexa-2,4-dienylium)-iron hexafluorophosphate, tricarbonyl(1-ethyl-4-isopropoxycyclohexa-2,4-dienylium)iron hexafluorophosphate, tricarbonyl(1-(methoxycarbonyl)-4-methoxycylohexa-2,4-dienylium-)iron tetrafluoroborate, and (π-cyclohexadienyl) tricarbonyl iron II hexafluoroarsenate.

These salts likewise satisfy the requirement that the central atom (iron) has a closed electron shell configuration, the iron contributing 7 electrons, the dienylium group contributing 5, and the carbonyl groups also contributing 2 each (i.e. 18 in all).

When $R^{10}$ is an aromatic diazonium ion, the aromatic group may be unsubstituted or substituted by one or more arylthio, aryloxy, dialkylamino, alkyl or alkoxy groups.

When $R^{10}$ is a metallocenium ion, the initiator may have the formula

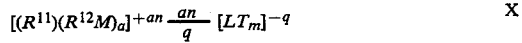

$$[(R^{11})(R^{12}M)_a]^{+an} \frac{an}{q} [LT_m]^{-q} \qquad X$$

wherein a is 1 or 2, each of n and q independently of the other is an integer from 1 to 3, M, L, T and m are as defined above, $R^{11}$ is a π-arene and $R^{12}$ is a π-arene or the anion of a π-arene.

Possible π-arenes $R^{11}$ and $R^{12}$ are, in particular, aromatic groups of 6 to 24 carbon atoms or heteroaromatic groups of 3 to 30 carbon atoms, which groups may be unsubstituted or mono- or polysubstituted by identical or different monovalent radicals such as halogen atoms, preferably chlorine or bromine atoms, or $C_1$–$C_8$ alkyl, $C_1$–$C_8$ alkoxy, cyano, $C_1$–$C_8$ alkylthio, $C_2$–$C_6$ monocarboxylic acid alkyl ester, phenyl, $C_2$–$C_5$ alkanoyl or benzoyl groups. These π-arene groups may be mononuclear, condensed polynuclear or non-condensed polynuclear systems, in which last-mentioned systems the nuclei may be linked together direct or through bridge members such as —S—, —O— or —C═C—.

$R^{12}$ as the anion of a π-arene may be an anion of a π-arene of the aforementioned kind, e.g. the indenyl anion, and, in particular, the cyclopentadienyl anion, which anions may also be unsubstituted or mono- or polysubstituted by identical or different monovalent radicals such as $C_1$–$C_8$ alkyl, $C_2$–$C_6$ monocarboxylic acid alkyl ester, cyano, $C_2$–$C_5$ alkanoyl or benzoyl groups.

Alkyl, alkoxy, alkylthio, monocarboxylic acid alkyl ester and alkanoyl substituents may be straight chain or branched. Typical alkyl, alkoxy, alkylthio, monocarboxylic acid alkyl ester or alkanoyl substituents are: methyl, ethyl, n-propyl, isopropyl, n-butyl, sec-butyl, tert-butyl, n-pentyl, n-hexyl, n-octyl, methoxy, ethoxy, n-propoxy, isopropoxy, n-butoxy, n-hexyloxy, n-octyloxy, methylthio, ethylthio, n-propylthio, isopropylthio, n-butylthio, n-pentylthio and n-hexylthio, carboxylic acid methyl ester methyl ester and n-pentyl ester, acetyl, propionyl, butyryl, and valeroyl. Alkyl, alkoxy, alkylthio and monocarboxylic acid alkyl ester groups containing 1 to 4 and especially 1 or 2 carbon atoms in the alkyl moieties and alkanoyl groups containing 2 or 3 carbon atoms are preferred. Preferred substituted π-arenes or anions of substituted π-arenes are those containing one or two of the above-mentioned substituents, in particular chlorine or bromine atoms, methyl, ethyl, methoxy, ethoxy, cyano, carboxylic acid methyl or ethyl ester groups and acetyl groups.

$R^{11}$ and $R^{12}$ may be identical or different π-arenes. Suitable heteroaromatic π-arenes are systems containing S—, N— and/or O-atoms. Heteroaromatic π-arenes containing S and/or O-atoms are preferred. Examples of suitable π-arenes are: benzene, toluene, xylenes, ethylbenzene, cumene, methoxybenzene, ethoxybenzene, dimethoxybenzene, p-chlorotoluene, chlorobenzene, bromobenzene, dichlorobenzene, acetylbenzene, trimethylbenzene, trimethoxybenzene, naphthalene, 1,2-dihydronaphthalenes, methoxynaphthalenes, ethoxynaphthalenes, chloronaphthalenes, bromonaphthalenes, biphenyl, stilbene, indene, biphenylene, fluorene, phenanthrene, anthracene, 9,10-dihydroanthracene, triphenylene, pyrene, naphthacene, coronene, thiophene, chromene, xanthene, thioxanthene, benzothiophene, naphthothiophene, thianthrene, diphenylene oxide, diphenylene sulphide, acridine and carbazole.

If a is 2, then each $R^{12}$ preferably the anion of a π-arene, and each M is an identical metal atom. Examples of anions of substituted π-arenes are: the anions of methyl-, ethyl-, n-propyl- and n-butylcyclopentadiene, the anions of dimethylcyclopentadiene, of cyclopentadiene carboxylic acid methyl ester and ethyl ester, and of acetylcyclopentadiene, propionyl-cyclopentadiene, cyanocyclopentadiene and benzoylcyclopentadiene. Preferred anions are the anion of unsubstituted indene and especially an anion of unsubstituted cyclopentadiene.

The preferred value of a is 1, $R^{11}$ is benzene, toluene, xylene, cumene, methoxybenzene, chlorobenzene, p-chlorotoluene, naphthalene, methylnaphtalene, chloronapthalene, methoxynaphthalene, biphenyl, indene, pyrene or diphenylene sulfide, and $R^{12}$ is the anion of cyclopentadiene, acetyl-cyclopentadiene or indene, or benzene, toluene, xylene, trimethylbenzene, naphthalene or methylnaphthalene.

Particularly preferred are complexes of formula X wherein a is 1, $R^{11}$ is cumene, $\eta^6$-pyrene or $\eta^6$-naphthalene, and $R^{12}$ the anion of $\eta^5$-cyclopentadiene, n is preferably 1 or 2, especially 1, and q is preferably 1. M is e.g.

Ti+, Ti$^{2+}$, Ti$^{3+}$, Zr+, Zr$^{2+}$, Zr$^{3+}$, Hf+, Hf$^{3+}$, Nb+, Nb$^{2+}$, Nb$^{3+}$, Cr+, Mo+, Mo$^{2+}$, W+, W$^{2+}$, Mn+, Nm$^{2+}$, Re+, Fe$^{2+}$, Co$^{2+}$, Co$^{3+}$, Ni$^{2+}$, or Cu$^{2+}$. Preferably, M is a chromium, cobalt, manganese, tungsten or molybdenum cation, especially an iron cation, most preferably Fe$^{2+}$.

The compounds of formula X may be prepared by methods known per se, e.g. as described in EP-A 94,915 by reacting a compound of formula.

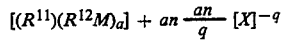   XI with a salt of an anion $[LT_m]^{-q}$, wherein a, m, n, q, R$^{11}$, R$^{12}$, M and L are as defined for formula X and $[X]^{-q}$ is an anion which differs from $[LT_m]^{-q}$.

Both the compounds of formula XI and the compounds of formula

   XII wherein a and M are as defined above, R$^{11'}$ is a π-arene or the anion or a π-arene and R$^{12}$ is an anion of a π-arene, may be prepared by reacting identical or different π-arenes in the presence of a Lewis acid with a salt of a metal of the groups IVb to VIIb, VIII or Ib of the Periodic Table. The compounds of formulae X, XI and XII are also suitable for effecting ligand exchange, by reacting said compounds in the presence of a Lewis acid with a π-arene which differs from R$^{11}$ and/or R$^{12}$ and R$^{11'}$ respectively. In these cases, n is preferably 2 and most preferably 1.

Compounds of formula X wherein L is a metal may also be obtained by reacting identical or different π-arenes in the presence of a Lewis acid with a suitable salt of a metal of groups IVb to VIIb, VIII or Ib of the Periodic Table, e.g. a titanium, zirconium, chromium, manganese and especially an iron salt. Finally, compounds of formula X may also be converted in conventional manner into complexes of formula X having a different anion $[LT_m]^{-q}$, by means of anion exchange.

In a preferred embodiment, uncharged π-complexes of formula XII, e.g. ferrocene or bis-($\eta^5$-indenyl) iron (II), are used as starting materials, and these are converted by ligand exchange into a complex of formula XI, which complex is subsequently reacted with a salt of an anion $[LT_m]^{-q}$. In this reaction, the complex of the formula XI obtained as intermediate is usually not isolated.

Suitable salts of anions $[LT_m]^{-q}$ are, e.g. alkali metal, alkaline earth metal or ammonium salts. It is preferred to be alkali metal salts, most preferably sodium and potassium salts.

Suitable Lewis acids for the above-described reactions are e.g. AlCl$_3$, AlBr$_3$, BF$_3$, SnCl$_4$ and TiCl$_4$, with AlCl$_3$ being preferred. It may be advantageous to perform the ligand exchange reactions by adding a reducing agent to the reaction mixture, e.g. aluminium or magnesium, or subsequently to add a reducing agent to the reaction mixture, e.g. Na$_2$SO$_3$ or ascorbic acid. Aluminium is the preferred reducing agent. The ligand exchange reactions are conveniently carried out in an inert organic solvent. Examples of suitable solvents are aliphatic or cycloaliphatic hydrocarbons such as octane, nonane, decane and cyclohexane. If desired, an excess of π-arene may also be used as solvent.

The reaction of the compounds of formula XI with a salt of an anion $[LT_m]^{-q}$ and the anion exchange conversion of compounds of formula X are conveniently conducted in an aqueous or aqueous-alcoholic medium, e.g. in mixtures of water and methanol or ethanol. The salts of the anions $[LT_m]^{-q}$ are used in at least stoichiometric amounts, but preferably in excess thereof.

Examples of suitable metals or non-metals L in the ion $[LT_m]^{-q}$ in all the above compounds are Sb, Fe, Sn, Bi, Al, Ga, In, Ti, Zr, Sc, V, Cr, Mn and Cu; lanthanides such as Ce, Pr and Nd, or actinides, such as Th, Pa, U or Np. Suitable non-metals are especially B, P and As. Preferably L is P, As, B or Sb, with P and Sb being most preferred.

Examples of complex anions $[LT_m]^{-q}$ are BF$_4^-$, PF$_6^-$, AsF$_6^-$, SbF$_6^-$, SbF$_5$(OH)$^-$, FeCl$_4^-$, SnCl$_6^{2-}$, SbCl$_6^-$, BiCl$_6^-$. The most preferred complex anions are SbF$_6^-$, BF$_4^-$, AsF$_6^-$ and PF$_6^-$.

When a compound of formula X is used as polymerisation initiator, it can be used in conjunction with an organic peroxide or hydroperoxide or a quinone.

A range of organic peroxides may be used such as 2,5-dimethyl-2,5-bis(benzoyl-peroxy) hexane, 2,5-dimethyl-2,5-bis (tert. butylperoxy) hexane, di-tert.butyl peroxide, dihexylene glycol peroxide, tert.butyl cumyl peroxide, isobutyl methyl ketone peroxide, and also per-acids and per-esters such as perbenzoic acid, tert.butyl peracetate, tert.butyl perbenzoate and tert.butyl perphthalate. Organic hydroperoxides which may be used include alkyl, aryl or aralkyl hydroperoxides having up to 18 carbon atoms. Typical hydroperoxides include methyl ethyl ketone hydroperoxide, tert.butyl hydroperoxide, cumene hydroperoxide and hydroperoxides formed by the oxygenation of cetene or cyclohexene, tert.butyl hydroperoxide and cumene hydroperoxide being especially effective. Suitable quinones include benzoquinone.

When (A) is a cationically polymerisable residue, suitable polymerisation initiators (B) include onium salts and iodosyl salts. Onium salts and iodosyl salts which, when combined with an epoxy resin and/or another cationically polymerisable material, give photopolymerisable mixtures are well known. For instance, suitable aromatic onium salts include those described in U.S. Pat. Nos. 4,058,400 and 4,058,401. Suitable aromatic sulphoxonium salts which can be used for the same purpose include those described in U.S. Pat. Nos. 4,299,938, 4,339,567, 4,383,025 and 4,398,014. Suitable aliphatic and cycloaliphatic sulphoxonium salts for this purpose include those described in European Patent Publication No. EP-A-0164 314. Aromatic iodonium salts which can be used for this purpose include those described in British Patent Specifications Nos. 1,516,351 and 1,539,192. Aromatic iodosyl salts which can be used include those described in U.S. Pat. No. 4,518,676.

It will be apparent to those skilled in the art of photopolymerisation that the initiators (B) listed above include some more useful when irradiated with radiation in, or close to, the visible region of the spectrum and others more useful when irradiated with shorter wavelength ultraviolet radiation. Choice of (B) will depend on whether (A) is to be polymerised at a wavelength longer or shorter than that at which (C) is to be solubilised and on the particular wavelength at which (C) is to be solubilised. This choice can be determined by simple experiment.

A hydroxyl compound which is copolymerisable with a cationically polymerisable material (A), for example a diol such as diethylene glycol or 1,4-butanediol, may also be included in the liquid composition.

When the liquid composition contains a cationically polymerisable residue (A) and an initiator (B) therefor, particularly where the initiator is a metallocenium ion of formula $[(R^{11})(R^{12}M)_a]^{+an}$, it may sometimes be necessary, when there is no peroxide, hydroperoxide or quinone present, to heat the composition following irradiation in stage (ii) in order to complete polymerisation to a tack-free solid state. The heating can be for periods of up to 30 minutes at temperatures up to 150° C. but usually heating for up to 10 minutes at 80° to 120° C. is sufficient.

Photosolubilisable materials that may be used as (C) include o-nitrobenzaldehyde, the polyoxymethylene polymers described in U.S. Pat. No. 3,991,033, the o-nitrocarbinol esters described in U.S. Pat. No. 3,849,137, the o-nitrophenyl acetals, their polyesters, and end-capped derivatives described in U.S. Pat. No. 4,086,210, sulphonate esters of aromatic alcohols containing a carbonyl group in a position alpha or beta to the sulphonate ester group, N-sulphonyloxy derivatives of an aromatic amide or imide, aromatic oxime sulphonates, quinone diazides, and resins containing benzoin groups in the chain, such as those described in U.S. Pat. No. 4,368,253.

Preferred photosolubilisable materials which can be used as residue (C) include o-quinone diazides.

Photosensitive o-quinone diazide compounds are well known. Examples include o-benzoquinone diazide sulphonyl or o-naphthoquinone diazide sulphonyl esters or amides of compounds, particularly aromatic compounds, having a hydroxy group or amino group respectively. Preferred o-quinone diazides are o-benzoquinone diazide sulphonyl and o-naphthoquinone diazide sulphonyl esters of phenols, including monohydric phenols and, particularly, polyhydric phenols such as 2,2-bis(hydroxyphenyl)propanes, dihydroxydiphenyls, di- and tri-hydroxy-substituted benzophenones, and phenolic resins, including phenol-aldehyde resins and polymers of phenols having polymerisable unsaturated substituents. Suitable phenol-aldehyde resins from which the esters may be derived include novolak resins prepared from phenol itself, an alkyl-substituted phenol such as o-, m- or p-cresol, o-, m- or p-tert.butylphenol, o-, m- or p-octylphenol, or a bisphenol such as 2,2-bis(4-hydroxyphenyl)propane, or a mixture of two or more of such phenols, and an aldehyde such as acetaldehyde, benzaldehyde, glyoxylic acid or, preferably, formaldehyde. Suitable polymers of unsaturated phenols from which the esters may be derived include homopolymers and copolymers of p-vinyl phenol and p-isopropenyl phenol.

Preferred o-quinone diazide sulphonyl esters of phenols are o-naphthoquinone diazide sulphonyl esters of polyhydroxybenzophenones or novolak resins derived from formaldehyde and an alkyl-substituted phenol or a mixture thereof with phenol. Particularly preferred esters are 1,2-naphthoquinone-2-diazide-5-sulphonyl esters of dihydroxybenzophenones, trihydroxybenzophenones, novolaks derived from formaldehyde and either a mixture of o-, m- and p-cresols or a mixture of phenol and p-tert.butylphenol.

The photosensitive quinone diazides hereinbefore described are either commercially available or may be prepared by conventional methods, for example by reacting a phenol with an esterifying derivative of an o-quinone diazide sulphonic acid, usually the sulphonyl chloride thereof, under conventional conditions.

Other preferred photosolubilisable materials for use as (C) are o-nitrophenyl acetals prepared from an o-nitrobenzaldehyde and a dihydric alcohol, polyesters of such acetals prepared by reaction of the acetals with a polycarboxylic acid or reactive derivative thereof such as an anhydride, and end-capped derivatives of such acetals prepared by reacting the acetals with a carboxylic acid or reactive derivative thereof. Preferred are acetals derived from o-nitrobenzaldehyde and a linear alkylene glycol in which the alkylene group has 4 to 15 carbon atoms which may be interrupted by at least one oxygen atom, or a glycol containing a cycloaliphatic ring of 4 to 7 carbon atoms, such as cycloalkylene glycol or a cycloalkylenealkylene glycol, and polyester and end-capped derivatives of such acetals.

Preferred linear glycols from which the acetals may be derived are 1,4-butanediol, 1,5-pentanediol, 1,6-hexanediol, 1,7-heptanediol, diethylene and dipropylene glycols and triethylene and tripropylene glycols. Preferred glycols having a cycloaliphatic ring are 2,2,4,4-tetramethyl-1,3-cyclobutanediol, bis(4-hydroxycyclohexyl)methane, 1,4-cyclohexanediol, 1,2-bis(hydroxymethyl)cyclohexane and, especially, 1,4-bis(hydroxymethyl)cyclohexane.

Preferred polyesteracetals are those prepared by reaction of the preferred acetals described above with an aromatic dicarboxylic or tricarboxylic acid or anhydride thereof, such as phthalic, terephthalic, and trimellitic acids and their anhydrides, and mixtures of two or more thereof. An especially preferred polyesteracetal is that prepared by reacting an acetal derived from o-nitrobenzaldehyde and 1,4-bis(hydroxymethyl)cyclohexane with trimellitic anhydride. Preferred end-capped polyacetals are those prepared by reaction of the preferred acetals described above with a monobasic carboxylic acid or reactive derivative thereof, such as acetic and benzoic acids and their chlorides.

Further preferred photosolubilisable materials for use as (C) are resins, particularly epoxide resins, polyurethanes and polyesters, containing benzoin groups in the chain, such as those described in U.S. Pat. No. 4,368,253. Preferred among these benzoin-containing resins are those containing benzoin groups in which the hydroxyl group on the carbon adjacent to the carbonyl group is etherified, that is benzoin alkyl ether groups where the alkyl group has 1 to 4 carbon atoms. Especially preferred are epoxide resins prepared by reacting a dihydroxybenzoin alkyl ether with a diglycidyl compound, particularly a diglycidyl ether of a dihydric alcohol or phenol or a diglycidylhydantoin. Epoxide resins containing benzoin groups can be used as dual-functional materials in the process of this invention, the epoxide groups providing cationic polymerisation in step (ii) and the benzoin groups providing photosolubilisation in step (iii).

Other preferred photosolubilisable materials for use as (C) are sulphonate esters of aromatic alcohols containing a carbonyl group in a position alpha or beta to the sulphonate ester group and aromatic N-sulphonyloxyimides. Preferred such esters and imides are those described in U.S. Pat. No. 4,618,564, preferably esters of benzoin or alpha-methylolbenzoin, especially benzoin-p-toluene sulphonate and 3-(p-toluenesulphonyloxy)-2-hydroxy-2-phenyl-1-phenyl-1-propanone, and N-sulphonyloxy derivatives of 1,8-naphthalimide, particularly N-benzenesulphonyloxy-and N-(p- dodecylbenzenesulphonyloxy)-1,8-naphthalimide.

Other preferred such esters and imides are organic polymers having a photosensitive residue containing either (a) a sulphonyloxy group attached through the oxy oxygen atom thereof to an aliphatic carbon atom which is in a position alpha or beta to a carbonyl group and alpha or beta to an aromatic group or (b) a N-sulphonyloxyimide group linked through the carbonyl groups thereof or the sulphur atom thereof directly to an aromatic group. Suitable such polymers are those containing at least one residue of formula

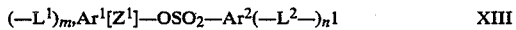

where
one of m' and n¹ denotes 1 and the other denotes 0 or 1,
Z¹ denotes either a group of formula

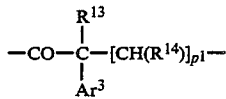

linked through the carbonyl group to an aromatic carbon atom in Ar¹, or
a group of formula

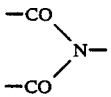

linked through the carbonyl groups to aromatic carbon atoms in Ar¹,
p¹ denotes zero or 1,
when p¹ denotes zero, $R^{13}$ denotes a hydrogen atom or a monovalent aliphatic, araliphatic or aromatic group,
when p¹ denotes 1, $R^{13}$ denotes a hydrogen atom, a hydroxyl group, an etherified hydroxyl group, an acyloxy group, an alkyl group or a phenyl-substituted alkyl group,
$R^{14}$ denotes a hydrogen atom or a monovalent aliphatic, cycloaliphatic, heterocyclic, aromatic or araliphatic group,
$Ar^1$ denotes a monovalent, divalent or trivalent aromatic group,
$Ar^2$ denotes a monovalent or divalent aromatic group,
$Ar^3$ denotes a monovalent or aromatic group, and $L^1$ and $L^2$ each denote —CO—, —COO—, —CONH—, —OCOO—, —NHCONH—, —OCONH—, —CSS—, —OCSS—, —OSO—, —CH₂—, —CH=, —O—, —S— or —N=.

Preferred such polymers are phenolic novolak resins in which at least 4% of the phenolic hydroxyl groups are replaced by a monovalent residue of formula XIII in which one of m' and n¹ denotes 1 while the other denotes zero, and
either $Z^1$ denotes a group of formula XIV where $Ar^1$ and $Ar^2$ each represent phenyl or phenylene, at least one of $Ar^1$ and $Ar^2$ representing phenylene, $Ar^3$ denotes phenyl, $R^{13}$ is —H, —OH, $C_1$-$C_4$ alkyl or alkoxy and $R^{14}$, when present, denotes —H or $C_1$-$C_4$ alkyl; or
$Z^1$ denotes a group of formula XV where $Ar^1$ denotes an o-phenylene, 1,8-naphthylene or benzene 1,2,4-triyl group and $Ar^2$ denotes phenyl, p-tolyl or m- or p-phenylene.

Polymers containing a residue of formula XIII can be prepared by reacting a polymer containing hydroxyl groups, such as a novolak resin, with a carboyxlic acid of formula

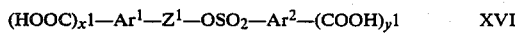

or an esterifying derivative thereof, where one of x¹ and y¹ denotes 1 and the other denotes zero or 1, and $Z^1$, $Ar^1$ and $Ar^2$ are as hereinbefore defined. A particularly preferred polymer is obtained by reacting a phenolic novolak with the acid chloride of N-(4-carboxyphenylsulphonyloxy)-1,8-naphthalimide, which acid is obtained by reaction of N-hydroxy-1,8-naphthalimide with 4-chlorosulphonylbenzoic acid.

Further preferred photosolubilisable materials for use as (C) are aromatic oxime sulphonates, preferably those described in European Patent Publication No. 0 199 672 or non-reactive derivatives of the reactive oxime sulphonates described in the cited publication. Particularly preferred oxime sulphonates are those of formula

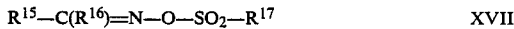

where
one of $R^{15}$ and $R^{16}$ denotes a monovalent aromatic group, especially phenyl or 4-methoxyphenyl, while the other denotes cyano, or $R^{15}$ and $R^{16}$, together with the carbon atoms to which they are attached, form a carbocyclic or heterocyclic group, especially a fluorene or anthrone ring system, and
$R^{17}$ denotes an aliphatic, carbocyclic, heterocyclic or araliphatic group, especially 4-tolyl, 4-chlorophenyl or 4-dodecylphenyl.

The oxime sulphonates can be prepared as described in EP-A- 0 199 672. The particularly preferred materials can be prepared by reacting an oxime of formula $R^{15}$—C($R^{16}$)=NOH with a sulphonyl chloride of formula $R^{17}SO_2Cl$, usually in an inert organic solvent in the presence of a tertiary amine.

As already indicated, the polymerisable residue (A) and the radiation-solubilisable residue (C) may be together in the same molecule, i.e. a dual-functional substance. Suitable dual-functional substances are those containing an acrylic group and an o-quinone diazide sulphonyl ester group, such as an o-quinone diazide sulphonyl ester of an amino- or carboxy-substituted phenol in which the amine or carboxyl group is acylated or esterified respectively by a residue containing an acrylic group. Suitable such esters are o-quinone diazide sulphonyl esters of reaction products of amino-substituted phenols with acryloyl chloride or methacryloyl chloride or reaction products of carboxy-substituted phenol, or acid halides thereof, with a hydroxyalkyl acrylate or methacrylate. Preferred such esters are o-quinone diazide sulphonyl esters of acryloylamino- or methacryloylamino-substituted phenols such as 4-(o-naphthoquinonediazidesulphonyloxy)methacryloylanilide.

Polymers of the dual-functional substances containing an acrylic group and a quinone diazide sulphonyl ester group constitute a further preferred class of photosolubilisable quinone diazide materials useful as (C). These polymers may be homopolymers or copolymers with one or more polymerisable ethylenically unsaturated materials, preferably acrylic monomers such as acrylic and methacrylic acids and alkyl and hydroxyalkyl acrylates and methacrylates. Preferred such polymers are copolymers of the o-quinone diazide sulphonyl esters of the acryloylamino- or methacryloylamino-substituted phenols described above with acrylic or methacrylic acid and methyl methacrylate or 2-hydroxyethyl methacrylate.

Where the photosolublisable material is a sulphonate ester of an aromatic alcohol, a N-sulphonyloxy derivative, an oxime sulphonate or a quinone diazide, as described above, if the material itself is not a film-forming polymer, an aqueous base-soluble film-forming polymer is included in the liquid composition when such a polymer will not be generated by the polymerisation in stage (ii). Preferably, an aqueous base-soluble film-forming polymer is included in the liquid composition even when such a polymer will be formed in stage (ii).

Suitable aqueous base-soluble film-forming polymers are those containing phenolic hydroxyl groups or carboxylic or sulphonic acid groups. Examples of such polymers are carboxyl-terminated polyesters, homopolymers and copolymers of ethylenically unsaturated phenols and homopolymers and copolymers of vinylsulphonic acid.

Preferred aqueous base-soluble film-forming polymers are novolak resins derived from an aldehyde such as acetaldehyde, furfuraldehyde or benzaldehyde, but preferably formaldehyde, and a phenol such as phenol itself, phenol substituted by 1 or 2 chlorine atoms, such as p-chlorophenol, phenol substituted by one or two alkyl groups of 1 to 9 carbon atoms each, e.g. o-, m- and p-cresol, the xylenols, p-tert.butylphenol and p-nonylphenol, p-phenylphenol, resorcinol, bis(4-hydroxyphenyl)methane, 2,2-bis(4-hydroxyphenyl)propane or mixtures of such phenols.

Other preferred film-forming materials are homopolymers and copolymers of ethylencially unsaturated carboxylic acids and carboxylic acid anhydrides. Such polymers include homopolymers of acrylic acid, methacrylic acid and maleic anhydride, and copolymers of these monomers with one or more other ethylenically unsaturated materials, for example, aliphatic unsaturated compounds such as ethylene, propylene, esters of acrylic and methacrylic acids, vinyl esters such as vinyl acetate, and vinyl aromatic compounds such as styrene and substituted styrenes.

The weight ratio of cationically polymerisable or free radical polymerisable material (A) to photosolubilisable residue (C) is not critical, as long as effective amounts of both components are used. Where (A) and (C) are on separate molecules, the weight ratio (A):(C) is generally within the range 10:1 to 1:10, preferably 5:1 to 1:2. The amount of polymerisation initiator (B) that is used is also not critical, as long as there is enough to initiate polymerisation of (A) during the first exposure to actinic radiation. Typical amounts of (B) are within the range 0.1-50 parts by weight of (B) per 100 parts of (A), preferably 0.5 to 10 parts.

The liquid compositions used in the present invention may also contain further additives known and conventionally employed in the technology of image formation. Examples of such additives are pigments, dyes, fillers and reinforcing agents, flame retardants, antistatic agents, levelling agents, antioxidants, light stabilisers and surfactants.

A hydrophilic polymer can be included in the liquid composition to facilitate the production of an image which is developable in water. Suitable hydrophilic polymers include polyalkylene glycols such as polyethylene glycol, polyacrylamides, polyvinyl pyrrolidones and, preferably, polyvinyl alcohols (hydrolysed polyvinyl acetates). When used, the hydrophilic polymer is generally present in an amount of 0.5 to 20% by weight of the composition.

Suitable sources of actinic radiation include carbon arcs, metal halide lamps, mercury vapour arcs, fluorescent lamps with phosphors emitting ultraviolet light, argon and xenon glow lamps, tungsten lamps, and photographic flood lamps. It is important that the first irradiation is effected using radiation of a different wavelength from that used in the second irradiation. The use of filters, to screen out irradiation of unwanted wavelengths, may be found to be advantageous since, in this way, a single, wide spectrum source of irradiation may be used. If such a single source of radiation is used, the first exposure is effected with a filter preventing radiation of a wavelength which will activate residue (C) from reaching the composition. In the second exposure, the whole unfiltered spectrum of radiation may be used, so that radiation which effects solubilisation of residue (C) can reach the composition.

As is well understood by those skilled in the art of photoimaging, these radiation sources emit small amounts of radiation over a range of wavelengths, but emit most of their radiation at a particular wavelength—the wavelength intensity maximum. When reference is made in this specification to the use of radiations having different wavelengths, it will be understood that it is the wavelength intensity maxima of the radiation used in stages (ii) and (iii) which must be different. Overlap of the spectral regions at which the radiations sources used in stages (ii) and (iii) emit small amounts of radiation will generally not inhibit successful operation of the process of the invention.

The first exposure (stage (ii)) need only be long enough to activate the polymerisation initiator (B). Ususally a few minutes is sufficient. The actual time needed can be readily determined by a simple experiment. The activated initiator (B) optionally in the presence of an organic peroxide or hydroperoxide causes residue (A) to polymerise. In some cases when using a compound of formula X as initiator (B), some heating may also be needed to assist the polymerisation. The composition may be heated to polymerise residue (A) for example at a temperature of 80° C. to 120° C. There is no need to heat any longer than the time needed to polymerise residue (A), a few minutes being sufficient. The actual temperature and time needed can be readily determined by simple experiment.

The compositions as described may be applied as a liquid to a substrate such as steel, aluminum, copper, paper, silicon or plastics. After the coating has been applied, the first exposure takes place, followed by heating where necessary, to solidify the composition. The coated substrate is then stable and may be stored for prolonged periods away from radiation which will solubilise (C). When desired, the coated substrate is given an imagewise exposure to actinic radiation of a different wavelength from that used in the first exposure. Those parts of the coating that have received the second exposure may then be removed by washing in a suitable organic solvent, or preferably, in an aqueous base solvent such as dilute aqueous sodium carbonate or sodium hydroxide.

The parts of the coating which have not received the second exposure are left on the substrate, forming a positive image. Thus the process of this invention may be used in the production of printing plates and printed circuits, using well known techniques.

The invention is illustrated by the following Examples, in which parts are by weight unless stated otherwise.

The polymerisable and photosolubilisable materials used in the Examples, designated Resins I to VI, are as follows:

RESIN I

A resin having a molecular weight of 1450 made by reacting a novolak, prepared from 3 moles of phenol and 1 mole of p-tert.butylphenol and formaldehyde, with 1,2-naphthoquinone-2-diazide-5-sulphonyl chloride so as to esterify 12% of the phenolic hydroxyl groups.

RESIN II

This denotes an ester of 1 mole of 2,3,4-trihydroxybenzophenone with 2.5 moles of 1,2-naphthoquinone-2-diazide-5-sulphonyl chloride.

RESIN III

A mixture of n-butanol (14.5 g) and powdered sodium hydroxide (8 g) is heated under nitrogen at 70° C. for one hour. 2-Chloroethylvinyl ether (21.3 g) is added dropwise over 1½ hours and stirring continued at 70°–80° C. for a further 5 hours. The resulting mixture is cooled and filtered. This gives 21 g of 2-butoxyethylvinyl ether as a brown liquid. IR (liq. film) 2965, 2940, 2880, 1621, 1328, 1211, 1080, 968, 828 cm$^{-1}$; NMR (DMSO-d$_6$) 0.5–1.2 (m-7H), 3.3–4.4 (m-8H), 6.5 (q-1H)$\delta$.

RESIN IV

A mixture of o-nitrobenzaldehyde (100.6 g), 1,4-bis(hydroxymethyl)cyclohexane (192 g), p-toluenesulphonic acid (0.2 g) and dichloromethane (600 g) is heated at reflux for 4½ hours whilst azeotroping the water out using a Dean and Stark apparatus. The mixture is then distilled until the temperature reaches 140° C. followed by stirring at 140° C. for 16 hours. The resulting mixture is distilled at 140° C. under reduced pressure and diluted with xylene (140 g) to a solids content of 66%. A portion of the resulting solution (40 g) is heated with trimellitic anhydride (12 g) at 150° C. for 4 hours. The mixture is then distilled at 150° C. under reduced pressure to yield 33 g of the desired polyesteracetal product.

RESIN V

A mixture of p-aminophenol (20 g), p-methoxyphenol (0.2 g), acetone (200 ml) and pyridine (15 g) is cooled to below 0° C. and methacryloyl chloride (21 g) is added dropwise, keeping the temperature below 0° C. After the addition is complete, the mixture is stirred for 2 hours at 0° C. and 2 hours at room temperature. The resulting mixture is concentrated to one third of its original volume and then poured into dilute hydrochloric acid (500 ml, pH=1). The precipitate formed is collected by filtration, dissolved in methanol and reprecipitated in dilute hydrochloric acid (500 ml, pH=1). The product is recrylstallized from aqueous ethanol to yield 8 g of p-hydroxymethacryloylanilide.

Chlorosulphonic acid (67.8 g) is added dropwise to o-naphthoquinone diazide-5-sulphonic acid sodium salt (13.6 g) at room temperature. The mixture is heated at 50° C. for 1 hour and added slowly to crushed ice (500 g). The resulting precipitate is collected and dissolved in dioxane (40 ml). The solution is added slowly to a mixture of p-hydroxymethacryloylanilide (8 g), triethylamine (4.9 g) and dioxane (60 ml), keeping the temperature below 10° C. After the addition is complete, stirring is continued for a further 2 hours at below 10° C. The mixture is then added to water (1000 g) containing concentrated hydrochloric acid (5.9 g). The resulting precipitate is filtered off and dried to give 10.4 g of the desired product, 4-(o-naphthoquinonediazide sulphonyloxy)methacryloylanilide.

RESIN VI

A mixture of methyl methacrylate (9 g), methacrylic acid (5 g), Resin V (6 g), azobis(isobutyronitrile) (0.2 g) and tetrahydrofuran (60 g) is heated at 60° C. under a nitrogen blanket for 6 hours. This mixture is then pured into hexane (300 ml) and the resulting precipitate collected and dried to give 7.8 g of the desired polymeric product.

In the following Examples, different radiation sources are used:

(1) 500 w tungsten lamp: this emits radiation above 450 nm, radiation of shorter wavelength being cut out by a filter.

(2) 5 kw metal halide lamp: this emits radiation of wavelength 340–450 nm, having a wavelength intensity maximum at 435 nm.

(3) Medium pressure mercury arc lamp: this emits radiation of wavelength 200–400 nm, having a wavelength intensity maximum at 365 nm.

EXAMPLE 1

Resin I (3 parts), 2-hydroxyethylmethacrylate (7 parts) and bis(pi-methylcyclopentadienyl)-bis(sigma hexaneoxytetrafluorophenyl) titanium (IV) (0.2 part) are mixed until homogeneous.

The mixture is coated onto a copper-clad laminate to a thickness of 36 micrometers. The coated laminate is then irradiated under nitrogen using a 500 w tungsten-halogen lamp fitted with a filter to cut out irradiation below 450 nm at a distance of 20 cm for 10 minutes. The solidified coating is then irradiated through a transparency using a 5 kW metal halide lamp at a distance of 75 cm for 2 minutes. Development in 0.5% aqueous sodium hydroxide solution with gentle rubbing gives a positive image of the transparency.

EXAMPLE 2

Resin I (5 parts), neopentyl glycol diacrylate (5 parts), 1,4-butanediol (2.5 parts) and bis(pi-methylcyclopentadienyl)-bis (sigma hexaneoxytetrafluorophenyl)titanium (IV) (0.2 part) are mixed until homogeneous.

The mixture is coated onto a copper-clad laminate to a thickness of 36 micrometers. The coated laminate is then irradiated under nitrogen using the 500 w tungsten-halogen lamp described in Example 1 for 5 minutes. The solidified coating is then irradiated through a transparency using a 5 kW metal halide lamp at a distance of 75 cm for 2 minutes. Development in 0.5% aqueous sodium hydroxide solution with gentle rubbing gives a positive image of the transparency.

EXAMPLE 3

Resin I (5 parts), alpha pinene oxide (5 parts), 1,4-butane diol (2.5 parts), (pi-2,4-cyclopentadien-1-yl)

((1,2,3,4,5,6-pi)-(1-methylethyl)-benzene)-iron II hexafluorophosphate (0.35 part) and cumene hydroperoxide (0.35 part) are mixed until homogeneous.

The mixture is coated onto a copper-clad laminate to a thickness of 36 micrometers. The coated laminate is then irradiated using the 500 w tungsten-halogen lamp described in Example 1 for 5 minutes. The solidified coating is then irradiated through a transparency using a 5 kW metal halide lamp at a distance of 75 cm for 2 minutes. Development in 0.5% aqueous sodium hydroxide solution with gentle rubbing gives a positive image of the transparency.

EXAMPLE 4

Resin I (3 parts), 2-hydroxyethylmethacrylate (7 parts) and DL-camphoroquinone (0.5 part) are mixed until homogeneous.

The mixture is coated onto a copper-clad laminate to a thickness of 36 micrometers. The coated laminate is then irradiated under nitrogen using the 500 w tungsten-halogen lamp described in Example 1 for 10 minutes. The solidified coating is then irradiated through a transparency using a 5 kW metal halide lamp at a distance of 75 cm for 2 minutes. Development in 1.5% aqueous sodium hydroxide solution with gentle rubbing gives a positive image of the transparency.

EXAMPLE 5

Resin I (6 parts), 2-hydroxyethylmethacrylate (2 parts), acrylic acid (2 parts) and bis(pi-methylcyclopentadienyl)-bis(sigma hexaneoxytetrafluorophenyl) titanium IV (0.15 part) are mixed.

The mixture is coated onto a copper-clad laminate to a thickness of 36 micrometers. The coated laminate is then irradiated under nitrogen using the 500 w tungsten-halogen lamp described in Example 1 for 5 minutes. The solidified coating is then irradiated through a transparency using a 5 kW metal halide lamp at a distance of 75 cm for 2 minutes. Development in 0.5% aqueous sodium hydroxide solution gives a positive image of the transparency.

EXAMPLE 6

Resin I (5 parts), alpha pinene oxide (7 parts), diphenyliodonium hexafluorophosphate (0.35 part) and acridine orange (0.05 part) are mixed.

The mixture is coated onto a copper-clad laminate to a thickness of 36 micrometers. The coated laminate is then irradiated using the 500 w tungsten-halogen lamp described in Example 1 for 5 minutes. The solidified coating is then irradiated through a transparency using a 5 kW metal halide lamp at a distance of 75 cm for 2 minutes. Developments in 0.5% aqueous sodium hydroxide solution with gentle rubbing gives a positive image of the transparency.

EXAMPLE 7

Resin I (5 parts), diallylbisphenol A (3.5 parts), ethyleneglycol bisthioglycollate (3.5 parts) and bis(pi-methylcyclopentadienyl)-bis(sigma hexaneoxytetrafluorophenyl)titanium IV (0.2 part) are mixed.

The mixture is coated onto a copper-clad laminate to a thickness of 36 micrometer. The coated laminate is then irradiated under nitrogen using the 500 w tungsten-halogen lamp described in Example 1 for 10 minutes. The solidified coating is then irradiated through a transparency using a 5 kW metal halide lamp at a distance of 75 cm for 2 minutes. Development in 0.5% aqueous sodium hydroxide solution with gentle rubbing gives a positive image of the transparency.

EXAMPLE 8

Resin I (4 parts), alpha-pinene oxide (5 parts), 1,4-butane diol (2 parts) and (pi-2,4-cyclopentadiene-1-yl)((1,2,3,4,5,6-pi)-(1-methyl ethyl)-benzene)-iron II hexafluorophosphate (0.35 part) are mixed until homogeneous.

The mixture is coated onto a copper-clad laminate to a thickness of 12 micrometers. The coated laminate is then irradiated using the 500 w tungsten-halogen lamp described in Example 1 for 10 minutes. The solidified coating is then irradiated through a transparency using a 5 kW metal halide lamp at a distance of 75 cm for 2 minutes. Development in 1% aqueous sodium hydroxide solution with gentle rubbing gives a positive image of the transparency.

EXAMPLE 9

Resin II (5 parts), 2-hydroxyethylmethacrylate (6 parts) and bis(pi-methylcyclopentadienyl)-bis(sigma hexaneoxytetrafluorophenyl) titanium IV (0.2 part) are mixed until homogeneous.

The mixture is coated onto a cooper-clad laminate to a thickness of 12 micrometers. The coated laminate is then irradiated under nitrogen using the 500 w tungsten-halogen lamp described in Example 1 for 5 minutes. The solidified coating is then irradiated through a transparency using a 5 kW metal halogen lamp at a distance of 75 cm for 3 minutes. Development in 0.5% aqueous sodium hydroxide solution with gentle rubbing gives a positive image of the transparency.

EXAMPLE 10

Resin I (3 parts), Resin III (7 parts) and (pi-2,4-cyclopentadien-1-yl) ((1,2,3,4,5,6-pi)-(1-methylethyl)-benzene) iron II hexafluorophosphate (0.35 part) are mixed until homogeneous.

The mixture is coated onto a cooper-clad laminate to a thickness of 36 micrometers. The coated laminate is then irradiated using the 500 w tungsten-halogen lamp described in Example 1 for 2 minutes. The solidified coating is then irradiated through a transparency using a 5 kW metal halide lamp at a distance of 75 cm for 2 minutes. Development in 0.5% aqueous sodium hydroxide solution with gentle rubbing gives a positive image of the transparency.

EXAMPLE 11

Resin IV (5 parts), 2-hydroxyethylmethacrylate (5 parts) and bis(pi-methylcyclopentadienyl) bis(sigma hexaneoxytetrafluorophenyl)titanium IV (0.2 part) are mixed until homogeneous.

The mixture is coated onto a copper-clad laminate to a thickness of 36 micrometers. The coated laminate is then irradiated under nitrogen using the 500 w tungsten-halogen lamp described in Example 1 for 10 minutes. The solidified coating is then irradiated through a transparency using a 5 kW metal halide lamp at a distance of 75 cm for 4 minutes. Development in 2% aqueous sodium carbonate solution with gentle rubbing gives a positive image of the transparency.

EXAMPLE 12

Resin I (5 parts), 3,4-epoxycyclohexylmethyl-3',4'-epoxycyclohexane carboxylate (5 parts), 1,4-butane diol (2.5 parts), triphenylsulphonium hexafluoroantimonte (0.5 part) and propylene carbonate (0.5 part) are mixed until homogeneous. The mixture is coated onto a copper-clad laminate to a thickness of 24 micrometers. The coated laminate is then irradiated under a medium pressure mercury arc lamp, having a wavelength intensity maximum at 365 nm, at a distance of 20 cm for 15 seconds to solidify the coating. The solidified coating is then irradiated through a transparency using a 5 kW metal halide lamp, having a wavelength intensity maximum at 435 nm, at a distance of 75 cm for 3 minutes. Development in 0.5% aqueous sodium hydroxide solution gives a positive image of the transparency.

EXAMPLE 13

Resin V (3 parts), 2-hydroxyethylmethacrylate (7 parts) and bis(pi-methylcyclopentadienyl)bis (sigma hexaneoxytetrafluorophenyl)titanium IV (0.2 part) are mixed until homogeneous.

The mixture is coated onto a copper-clad laminate to a thickness of 12 micrometers. The coated laminate is then irradiated under nitrogen using the 500 w tungsten-halogen lamp described in Example 1 for 7½ minutes. The solidified coating is then irradiated through a transparency using a 5 kW metal halide lamp at a distance of 75 cm for 2 minutes. Development in 0.5% aqueous sodium hydroxide solution with gentle rubbing gives a positive image of the transparency.

EXAMPLE 14

Resin VI (3 parts), 2-hydroxyethylmethacrylate (7 parts) and bis(pi-methylcyclopentadienyl)bis(sigma hexaneoxytetrafluorophenyl) titanium IV (0.2 part) are mixed until homogeneous.

The mixture is coated onto a copper-clad laminate to a thickness of 12 micrometers. The coated laminate is then irradiated under nitrogen using the 500 w tungsten-halogen lamp described in Example 1 for 5 minutes. The solidified coating is then irradiated through a transparency using a 5 kW metal halide lamp at a distance of 75 cm for 2 minutes. Development in 0.5% aqueous sodium hydroxide solution with gentle rubbing gives a positive image of the transparency.

What is claimed is:

1. A process for the formation of an image which comprises
   (i) applying to a substrate a layer of a liquid composition comprising
      (A) a group or combination of groups which is cationically polymerizable or polymerizable by means of free radicals,
      (B) a radiation-activated polymerization initiator for (A) and
      (C) a radiation-solubilizable group, the groups (A) and (C) being in the same substance or in different substances,
   (ii) subjecting the composition to radiation having a wavelength at which (B) is activated but at which (C) is not substantially activated, or subjecting the composition to said radiation followed by heating, thereby polymerizing (A) such that the layer of liquid composition is solidified,
   (iii) subjecting the solidified layer in a predetermined pattern to radiation having a wavelength which is different from that of the radiation used in stage (ii) at which the group (C) is activated, such that the solidified layer is rendered more soluble in a developer in exposed areas than in unexposed areas, and
   (iv) removing the exposed areas by treatment with a developer.

2. A process according to claim 1, in which the liquid composition comprises (B) a radiation-activated polymerization initiator and
   (1) a mixture of at least one substance having a polymerizable group or combination of groups (A) and at least one substance having a radiation solubilizable group (C) which is activated by radiation at a wavelength which is different from that at which (B) is activated or
   (2) at least one dual-functional substance having in the same molecule a polymerizable group (A) and a radiation solubilizable group (C) which is activated by radiation at a wavelength which is different from that at which (B) is activated, or
   (3) at least one said dual-functional substance together with at least one substance having a polymerizable group (A) and/or at least one substance having a radiation-solubilizable group (C).

3. A process according to claim 1, in which (C) is activated by radiation at a shorter wavelength than that at which (B) is activated.

4. A process according to claim 3, in which stage (ii) is effected using radiation in the visible spectrum and stage (iii) is effected using ultraviolet radiation.

5. A process according to claim 1, in which (C) is activated by radiation at a longer wavelength than that at which (B) is activated.

6. A process according to claim 1, in which (A) is an ethylenically unsaturated group or a mixture of an ethylenically unsaturated group and a thiol group.

7. A process according to claim 6, in which (A) is provided by an ester having a group of formula $$CH_2=C(R^1)COO— \qquad I$$

where $R^1$ is a hydrogen, chlorine or bromine atom or an alkyl group of 1 to 4 carbon atoms.

8. A process according to claim 7, in which (A) is provided by a monoacrylate or monomethacrylate.

9. A process according to claim 6, in which (A) is provided by a mixture of a phenol substituted by two or more allyl groups and a polythiol.

10. A process according to claim 1, in which the initiator (B) is a benzoin ether, an acyloin ether, a halogenated alkyl or aryl derivative, an aromatic carbonyl derivative, a metallocene, a mixture of a Group IVA organometallic compound with a photoreducible dye, a quinone, an aliphatic dicarbonyl compound, a 3-ketocoumarin, an acyl phosphine oxide, a metal carbonyl or a mixture of a photoreducible dye with a reducing agent.

11. A process according to claim 1, in which (A) is provided by a 1,2-epoxide, a vinyl ether or a mixture thereof.

12. A process according to claim 11, in which (A) is provided by a glycidyl ether of a monohydric alcohol or phenol, a cycloaliphatic monoepoxide, a glycidyl ester of a monocarboxylic acid or a vinyloxyalkyl ether of an alcohol or phenol.

13. A process according to claim 11, in which the initiator (B) is a compound of formula $$[R^{10}]^{+an}\frac{an}{q}[LT_m]^{-q} \qquad VII$$

where L is a divalent to heptavalent metal or non metal, T is a halogen atom, or one of the groups T is hydroxyl, the remainder being halogen, q is an integer from 1 to 3, m is an integer corresponding to the valency of L+q, a is 1 or 2, n is an integer of 1 to 3 and $R^{10}$ is an ion selected from:
  (i) aromatic iodonium ions;
  (ii) $[G-Z-(CO)_x]^+$
wherein G represents an arene or dienylium group; Z represents an atom of a d-block transition element chosen from titanium, vanadium, chromium, manganese, iron, cobalt, nickel, copper, niobium, molybdenum, ruthenium, rhodium, palladium, silver, tantalum, tungsten, rhenium, osmium, iridium, platinum and gold; and x is a positive integer such that the atom Z has a closed shell electron configuration;
  (iii) aromatic diazonium ions;
  (iv) $[R^{11})(R^{12}M)_a]^{+an}$
wherein a is 1 or 2, n is an integer of 1 to 3, M is the cation of a monovalent to trivalent metal from groups IVb to VIIb, VIII or Ib of the Periodic Table; $R^{11}$ is a pi-arene and $R^{12}$ is a pi-arene or the anion of a pi-arene;
  (v) sulfonium ions;
  (vi) sulfoxonium ions; and
  (vii) iodosyl ions.

14. A process according to claim 1, in which (C) is provided by an o-quinone diazide, a nitrophenyl acetal or a polyester derivative or end-capped derivative thereof, a resin having a benzoin group in the chain thereof, a sulfonate ester of an aromatic alcohol containing a carbonyl group in a position alpha or beta to the sulfonate ester group, an aromatic N-sulfonyloxyimide or an aromatic oxime sulfonate.

15. A process according to claim 1, in which the liquid composition comprises a dual-functional substance having an acrylic group and an o-quinone diazide sulfonyl ester group.

16. A process according to claim 14, in which the liquid composition also contains an aqueous base-soluble film-forming polymer.

17. A process according to claim 16, in which the film-forming polymer is a novolak resin or a homopolymer or copolymer of an ethylenically unsaturated carboxylic acid or anhydride.

18. A process according to claim 1, in which stage (iv) is effected by treatment with an aqueous base.

19. An image formed by a process according to claim 1.

* * * * *